(12) United States Patent
Gu et al.

(10) Patent No.: US 7,553,772 B1
(45) Date of Patent: Jun. 30, 2009

(54) PROCESS AND APPARATUS FOR SIMULTANEOUS LIGHT AND RADICAL SURFACE TREATMENT OF INTEGRATED CIRCUIT STRUCTURE

(75) Inventors: Shiqun Gu, Vancouver, WA (US); Wai Lo, Lake Oswego, OR (US); Hong Lin, Vancouver, WA (US)

(73) Assignee: LSI Corporation, Milpitas, CA (US)

( * ) Notice: Subject to any disclaimer, the term of this patent is extended or adjusted under 35 U.S.C. 154(b) by 456 days.

(21) Appl. No.: 11/046,949

(22) Filed: Jan. 31, 2005

(51) Int. Cl.
*H01L 21/302* (2006.01)
*H01L 21/461* (2006.01)

(52) U.S. Cl. .............. 438/709; 438/711; 438/798; 257/E21.328; 257/E21.475; 427/509; 427/554

(58) Field of Classification Search .......... 438/709, 438/711, 798, 792, 676, 667, 677; 257/E21.305, 257/E21.328, E21.471, E21.475; 427/509, 427/554, 553, 558, 572
See application file for complete search history.

(56) References Cited

U.S. PATENT DOCUMENTS

| 4,687,544 | A | * | 8/1987 | Bersin ................... 438/709 |
| 4,818,326 | A | * | 4/1989 | Liu et al. ............... 156/345.36 |
| 5,014,646 | A | * | 5/1991 | Ito et al. ................ 118/725 |
| 6,995,051 | B1 | * | 2/2006 | Furukawa et al. ........... 438/157 |
| 7,094,670 | B2 | * | 8/2006 | Collins et al. ............... 438/513 |
| 2002/0182877 | A1 | * | 12/2002 | Nantel et al. ................ 438/708 |

* cited by examiner

*Primary Examiner*—Caridad M Everhart
(74) *Attorney, Agent, or Firm*—Luedeka, Neely & Graham, P.C.

(57) ABSTRACT

Process and apparatus provide reactive radicals generated from a remote plasma source which contact a portion of a substrate surface simultaneous with a contact of the same substrate surface with a light source which locally activates the portion of the substrate surface in contact with said radicals.

14 Claims, 5 Drawing Sheets

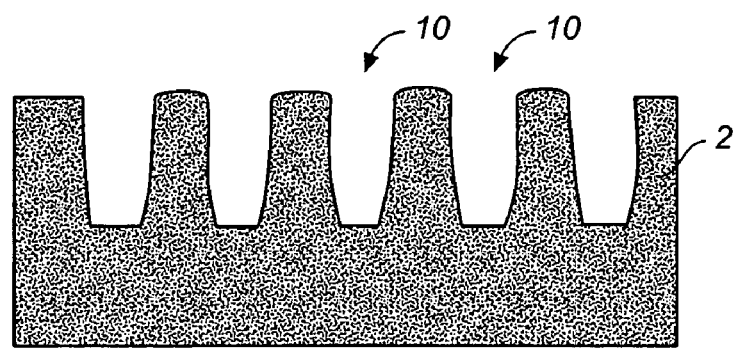
FIG._1
*(PRIOR ART)*
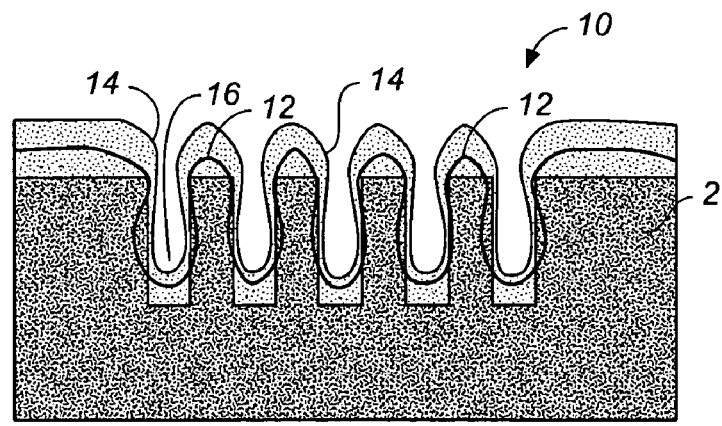
FIG._2
*(PRIOR ART)*
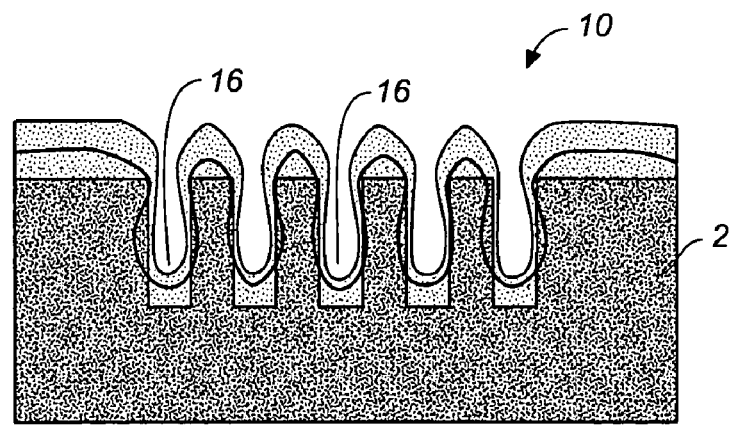
FIG._3
*(PRIOR ART)*

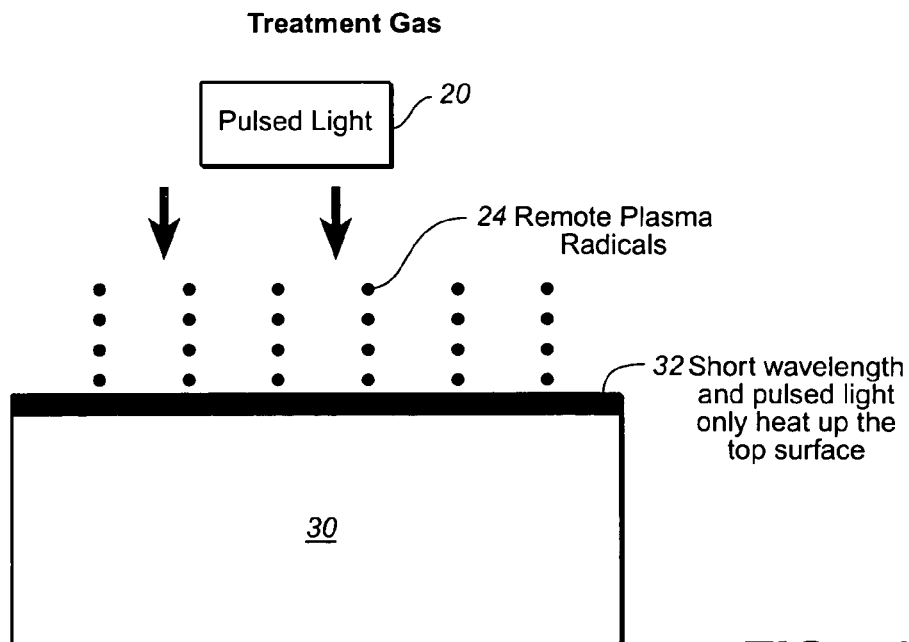
FIG._4
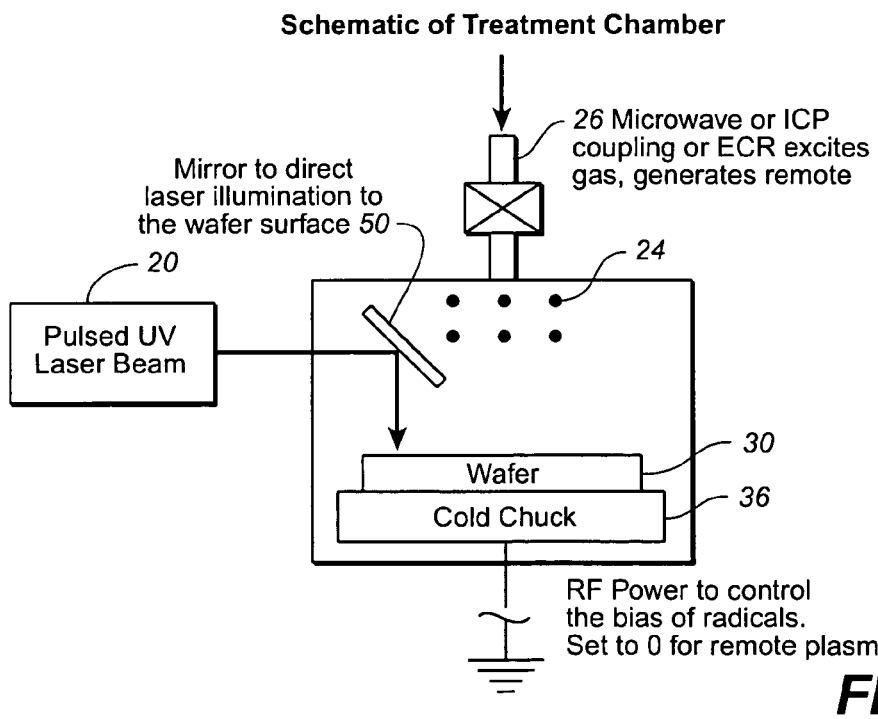
FIG._5

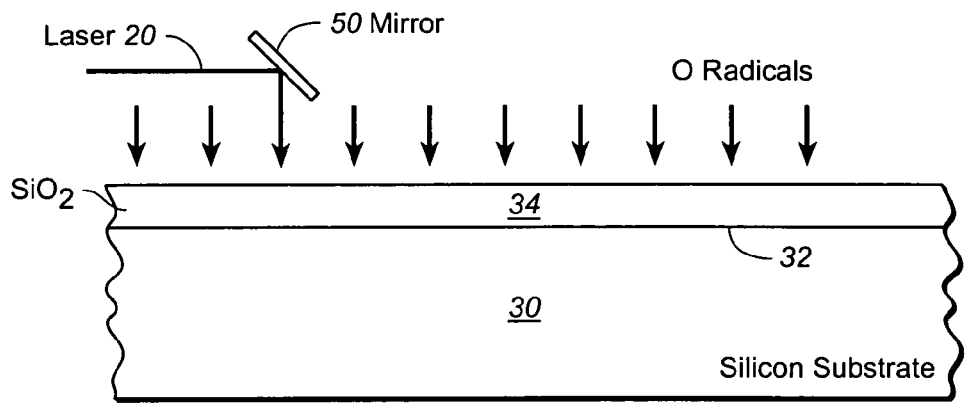
FIG._6
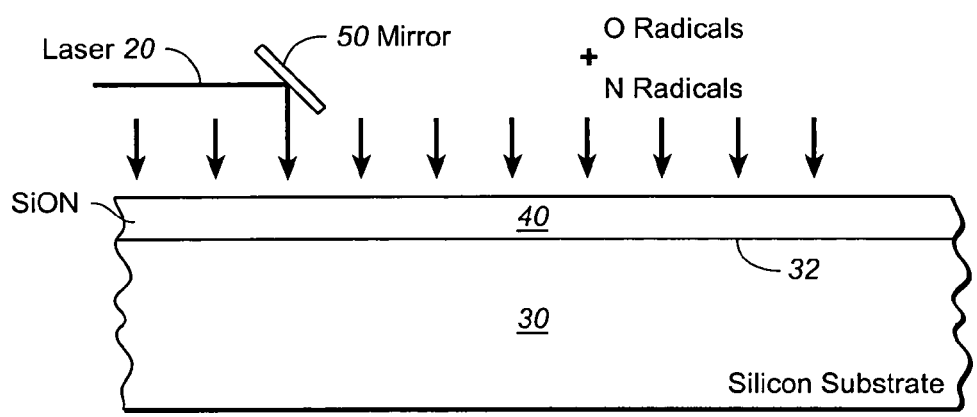
FIG._7A
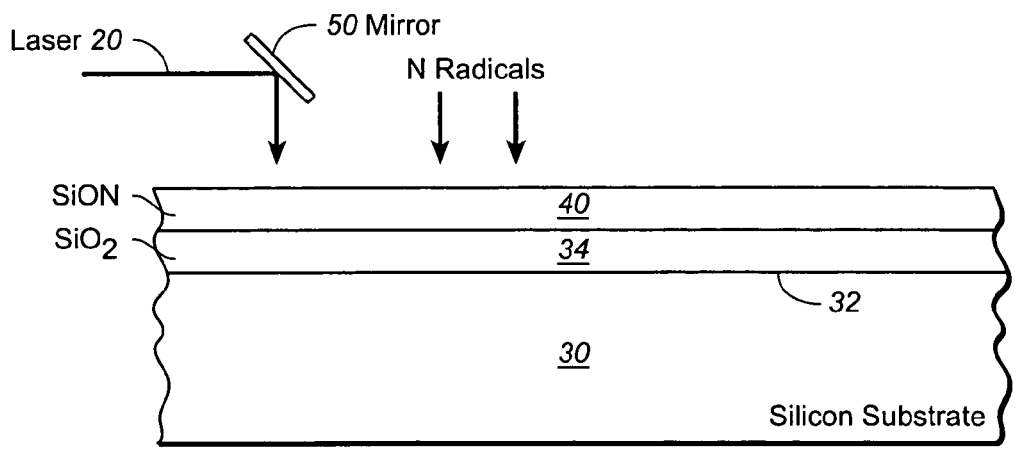
FIG._7B

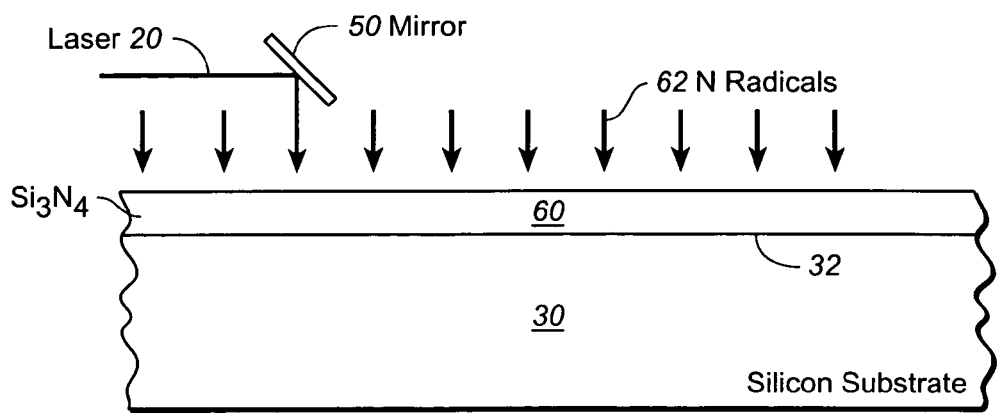
FIG._8
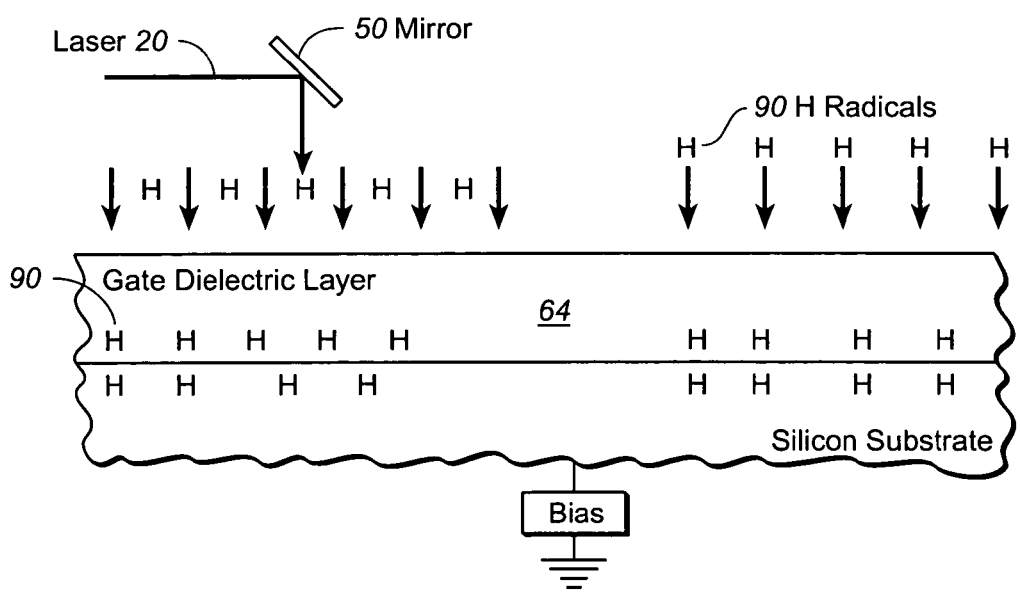
FIG._9

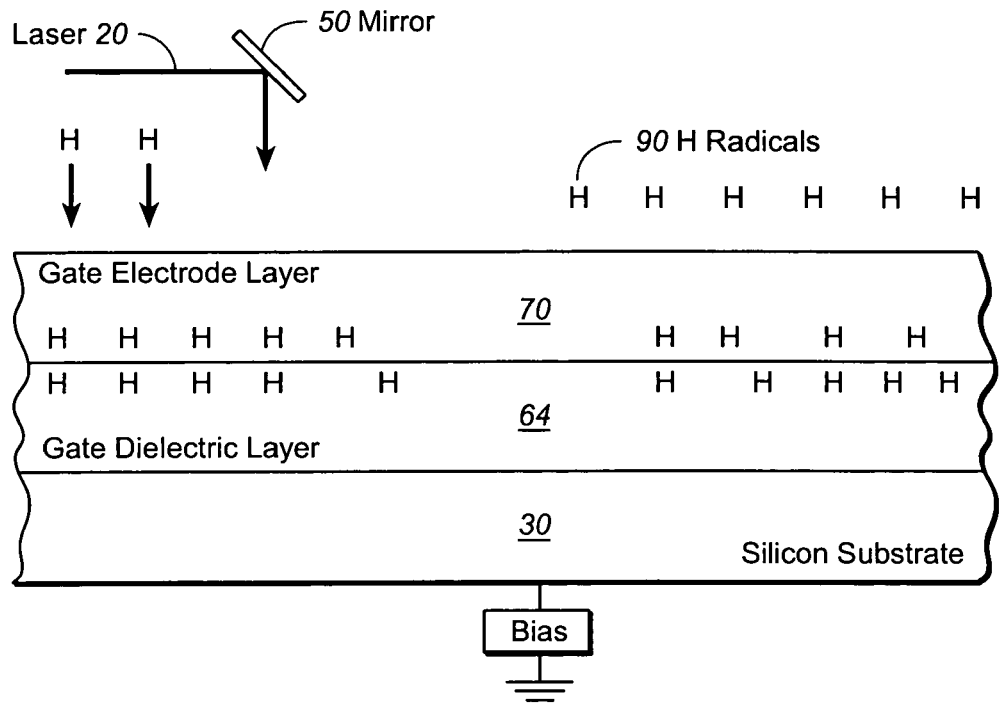
FIG._10
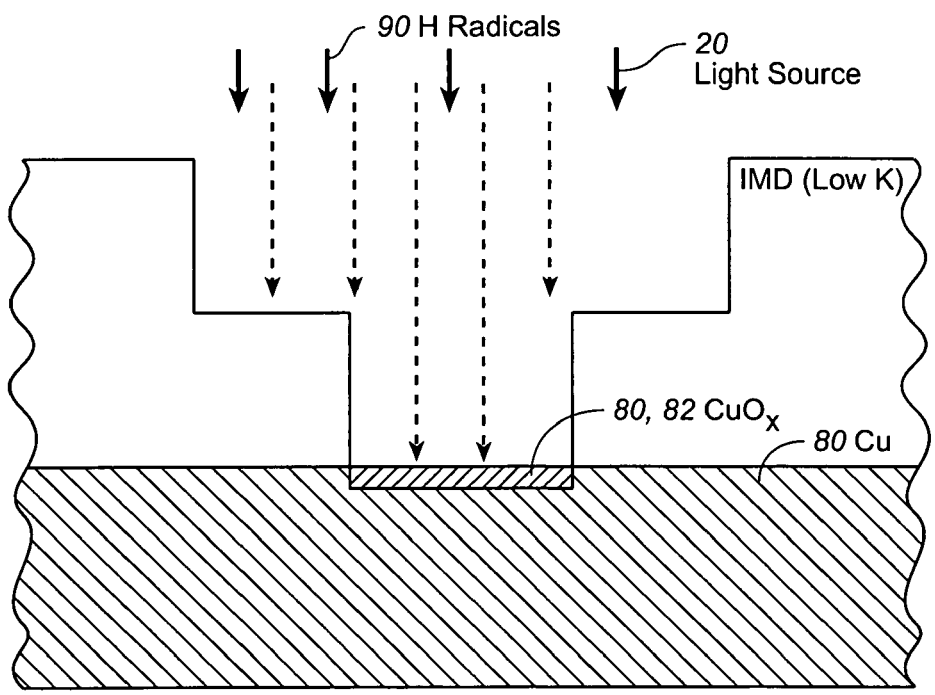
FIG._11

PROCESS AND APPARATUS FOR SIMULTANEOUS LIGHT AND RADICAL SURFACE TREATMENT OF INTEGRATED CIRCUIT STRUCTURE

BACKGROUND OF THE INVENTION

1. Field of the Invention

This invention relates to a process and apparatus for simultaneous treatment of a surface of an integrated circuit structure using a remote plasma source to generate radicals, and spatially selective heating of portions of the surface with a light source such as a laser beam.

2. Description of the Related Art

Modification of the structure of surfaces of substrates such as a silicon wafer is needed at various steps or stages of CMOS transistor fabrication. For example, removal of contaminants and particles embedded in silicon wafer surfaces can be carried out by cleaning the wafer surface using the well known RCA cleaning process (using, sequentially, aqueous basic and acidic solutions). Such cleaning steps are critical prior to diffusion or oxide growth processes, although these cleaning steps normally result in the formation of undesirable native oxides on the cleaned surfaces. To ensure the absence of native oxides on cleaned silicon wafers, an HF-last process that forms H—Si bonds is frequently used.

If a thin layer of silicon nitride is needed on the surface of the cleaned silicon wafer, this can be achieved using an $NH_3$ anneal, resulting in the formation of nitrides through chemical reactions during the anneal.

Direct plasma nitridation (DPN) and remote plasma nitridation (RPN), on the other hand, have been used for implanting nitrogen radicals into ultra-thin $SiO_2$, either during its growth through ozone ($O_3$) plasma oxidation, or after the growth of the films, to form silicon oxynitride.

Formation of a protective liner or barrier layer, such as a Ta/TaN or TiN layer to separate copper filler material from dielectric material in a via or trench interconnect, requires prior cleaning to remove the oxidized copper metal surface. An account of such different surface modification techniques, their applications, their advantages and shortcomings is given in Table 1 below:

TABLE 1

SURFACE STRUCTURE MODIFICATION TECHNIQUES COMMONLY USED IN CMOS FABRICATION

| MODIFICATIONS TECHNIQUE | FEATURES | ADVANTAGES | DISADVANTAGES | APPLICATIONS |
|---|---|---|---|---|
| Chemical: RCA, HF-last | Wet, low temperature | Low temperature, can result in clean surfaces | Abrasive, cannot control final surface structure easily; weak structures, may not be able to form certain bondings | General surface cleaning |
| Thermal: $NH_3$ anneal, forming gas anneal | High temperature, involves diffusion | Can form a variety of bondings, repair structure defects; reduced defect density | Diffusing of dopants and result in undesirable dopant profiles; high thermal budget and may result in chemical reactions between different materials | Surface prep before high k deposition |
| Plasma: Direct plasma nitridation DPN | Direct plasma coupling | Excited atomic/ionic/molecular species that can form bondings with wafer surfaces | Severe surface damage, uncontrolled implantation, undesirable sub-surface bond formation, need thermal activation to complete bond formation | SiON formation |
| Plasma: Remote Plasma Nitridation RPN | Downstream plasma coupling | Excited atomic/ionic/molecular species that can form bondings with wafer surfaces | Need thermal activation to complete bond formation | SiON formation |
| RF preclean for liner Ta/TaN or TiN deposition | Ar sputtering | Physical ion sputtering to remove the oxidized metal surface (Cu) for back end line processing (BEOL) interconnect | RIE sputtering attacks the low K, bowing profile and resulting difficulty for plug fill (electrical plating). In addition, RIE plasma can result in charge to gate damage | RF preclean for liner Ta/TaN or TiN deposition |

Furthermore, wet process steps, dry processing steps, and thermal anneal, when used with the same wafer, requires manual removal of the wafer from one apparatus to another apparatus, e.g., transfer of the wafer from a wet processing apparatus to a vacuum apparatus. Such transfer steps would expose wafers to atmosphere and slow down the overall efficiency of the processing of the wafer.

With the introduction of new materials and architectural changes in the forth coming CMOS transistors, new challenges have been imposed on development of novel surface structure modification techniques. Examples of these challenges include the following.

High k Dielectrics-Si Substrate Interface

The structure of the interface between high K dielectrics and Si substrates is known to be difficult to control since chemical reactions between the dielectrics and the substrate tend to occur during film deposition and subsequent thermal treatments. This results in high equivalent oxide thickness (EOT) high density of state, high interface charge, threshold voltage instability and lower channel mobility in transistors. To minimize the reactions, it is necessary to grow an ultra-thin buffer layer (e.g., 1 mono-layer) of a known chemically inert compound, such as Si nitride, silicon oxynitride, or silicon oxide, before the deposition of the dielectrics without raising the overall EOT of the dielectric. This highly controlled surface modification technique is yet to be developed.

High k Dielectrics-Electrodes Interface

The highly controlled surface modification technique is also required to engineer the interface layer between metal gate electrode and high-k dielectrics. It has been found that the interfacial bonding reactions, interfacial stability, fixed charges have significant impact on metal gate work function, threshold voltage control, EOT, and device drive current.

Strained Si-Substrate Interface

Strained Si is normally fabricated by growing Si epitaxially on a substrate with slightly different lattice parameters, e.g., SiGe. One requirement of the substrate is that it should be completely free of contaminants, particles, native oxides, and structural defects before Si epitaxial growth or structural defects, such as vacancies, dislocations, inclusions, and twins, will exist at the Si to substrate interface and results in the relaxing of strains. Current surface cleaning techniques can eliminate surface contaminants, particles, and native oxides but cannot control the surface structural features.

Back End of Line (BEOL) RF Preclean

RF clean showed effective clean method for the BEOL interconnect. However, when the ions hit the bottom of the via holes, they are reflected back and damage the sidewall. In addition, some of the ions can directly hit the sidewall and damage the sidewall. To reduce the metal line-to-line capacitance, low K materials have been used for the inter metal dielectric (IMD). The weak structure of the low K dielectric material make them very susceptible to damage by high energy ions.

Prior art FIGS. 1-3 show, in FIG. 1, a trench profile 10 after the trench formation in silicon substrate 2. FIG. 2 then shows trench profile 10 of FIG. 1 after a conventional prior art RF preclean and deposition of liner 12, showing, at 14, serious bowing of the trench profile. With such bowing of the sidewalls of the trench, and the reduced metal line width, subsequent electroplating is more difficult, resulting in the start of void formation in the prior art structure of FIG. 2, as shown at 16 in FIG. 3.

It would, be desirable to provide a process for treatment, including cleaning and activation, of a substrate surface capable of being utilized with a number of different materials in the same apparatus.

SUMMARY OF THE INVENTION

In accordance with the invention, the process and apparatus of the invention provide simultaneous radical and light treatment of a substrate surface. The radical treatment of the substrate surface comprises exposing the substrate surface to remote plasma source generated radicals. The light treatment of the substrate surface comprises treating a portion of the substrate surface with, for example, a spatially selective laser beam which locally and thermally activates at least a portion of the substrate surface contacted by the radicals.

BRIEF DESCRIPTION OF THE DRAWINGS

FIG. 1 is a fragmentary vertical cross sectional view of a prior art trench profile after trench formation.

FIG. 2 is a fragmentary vertical cross sectional view of the prior art trench structure of FIG. 1 after a conventional prior art RF preclean and liner deposition showing bowing of the trench profile.

FIG. 3 is a fragmentary vertical cross sectional view of the prior art trench profile of FIG. 2 showing the negative effect of the prior art RF precleaning and formation of liner material on subsequent electroplating and generation of voids.

FIG. 4 is a schematic view of the process of the invention.

FIG. 5 is a fragmentary vertical cross sectional view of apparatus for the process of the invention.

FIG. 6 is a fragmentary vertical cross sectional view showing the formation of a $SiO_2$ layer on the surface of a silicon substrate using the process of the invention.

FIG. 7A is a fragmentary vertical cross sectional view showing the formation of a SiON layer on the surface of a silicon substrate using the process of the invention.

FIG. 7B is a fragmentary vertical cross sectional view showing the formation of a SiON layer using $SiO_2$ already on the surface of a silicon substrate using the process of the invention.

FIG. 8 is a fragmentary vertical cross sectional view showing the formation of a $Si_3N_4$ layer on the surface of a silicon substrate using the process of the invention.

FIG. 9 is a fragmentary vertical cross sectional view showing the hydrogen passivation of an interface between the upper surface of a silicon layer and the lower surface of a gate dielectric layer using the process of the invention.

FIG. 10 is a fragmentary vertical cross sectional view showing the hydrogen passivation of an interface between the upper surface of a gate dielectric layer and the lower surface of a gate electrode, using the process of the invention.

FIG. 11 is a fragmentary vertical cross sectional view showing the hydrogen passivation of the surface of Cu before Ta/TaN liner formation, which reduces the top surface CuO to metallic Cu state, using the process of the invention.

DESCRIPTION OF THE PREFERRED EMBODIMENTS a. Introduction

The invention comprises a process and apparatus to provide radicals generated from a remote plasma source which contacts a substrate surface simultaneous with treatment of the substrate surface with a spatially selective light source (e.g. laser beam) which provides energy locally to at least a portion of the substrate surface being contacted by the radicals. The combining of:

1) a remote plasma source for generation of suitable reactive radicals and optional voltage biasing (for controlling the kinetic energy of radicals, as well as the extent of radical embedding in the substrate, and minimizing damage to the substrate); and 2) surface anneal techniques;

provides a single synergetic step for achieving controlled and selective modification of a substrate surface. Remote plasma will generate excited radicals, which can potentially modify the substrate surface. Surface anneal selectively activates the reaction between the substrate surface and the radicals generated by the remote plasma source.

That is, the focused beam of light will modify the surface bonding without heating the bulk of the substrate, as shown in FIGS. 5-11 below. The simultaneous yet programmable treatment of the substrate surface with light, as shown in particular, in FIGS. 4 and 5 (as will be described below), can be achieved by a light source (e.g., pulsed laser) which will deliver photon energy only to the wafer surface without heating up the bulk of the substrate. The remote plasma can be generated by techniques such as microwave power, inductive coupling source, or ECR, as also shown in FIGS. 4 and 5. The radicals can be changed according to the application. Some of these applications are listed in Table 2 below. While the substrate used in the invention may comprise any material capable of reacting with the radicals, in the plane in the plasma, a silicon substrate is described herein by way of illustration and not of limitation.

TABLE 2

APPLICATIONS FOR THE SIMULTANEOUS
PLASMA/LOCAL HEAT TREATMENT TECHNIQUE

| APPLICATION | TECHNIQUES | ADVANTAGES |
|---|---|---|
| Passivate Si surface and terminate Si—O or SiOH bonds | Use $H_2$ remote plasma and pulsed light (laser) to heat up the Si surface and reduce Si oxide to Si—H state | Improved uniform surface coverage and minimum defect (dangling bond) density |
| Surface preparation before high K deposition | Use $N_2$ or $O_2$ plasma for the formation of single SiN or SiO buffer layer before the deposition of high K dielectrics for preventing chemical reactions, minimizing interface density of state and improving channel mobility. | Improved control of surface coverage, final structure and thickness |
| SiON Formation | Use remote $NO_2$, NO, $N_2$ plasma with suitable bias voltage and pulsed light (e.g. laser) to heat up the Si/$SiO_2$ surface to generate SiON with controlled N distribution profile. | Better quality of SiON with lower surface defect density Anneal the film during formation No change of dopant profile |
| Strained Si (or Ge) on SiGe deposition preclean | Use $H_2$ or $NH_3$ remote plasma and light (e.g. laser) to heat up the Si surface and to convert Si—O, or Si—OH bonding to Si—H | Reduce the defect density between Si (or Ge) and SiGe interface No change of dopant profile |
| Metal gate deposition preclean | Use a plasma and light treatment to form a passivation monolayer on high K surface before the deposition of metal gates. The types of passivation materials depend on both high K dielectrics and metal gates used. | Reduced chemical reactions between high K and metal gates Improve the thermal stability of the gate stack Reduce fixed charges |
| RF preclean for liner Ta/TaN or TiN deposition | Use $H_2$, $H_2$/He, $H_2$/$N_2$ or $NH_3$ remote plasma and pulsed light (laser) to heat up the Cu surface and reduce Cu oxide to metallic Cu state | No RIE sputtering No thermal change of FEOL devices No plasma charge No plasma damages to IMD (e.g. low K) and trench/via profile. | b. Features and Advantages of the Invention

The following are features and advantages of the invention:
1. The remote plasma is used with suitably biased voltages to generate the active radicals.
2. Surface anneal techniques are used to activate the surface reaction without damage to the device.
3. Both techniques are incorporated together to form an integrated, simultaneous treatment system
4. There is no undesirable damage to the substrate surface from the plasma treatment.
5. Surface anneal activates the surface bondings and reduces surface defect density.
6. There is no heating of substrate and limited diffusion of the radicals into the substrate.
7. The process is a simultaneous, integrated process.
8. The cycle time for wafer processing is short.

c. The Remote Plasma of Radicals

The term "radical", as used herein, is intended to define a specie containing one or more atoms in an excited or "high-energy" state above the ground state of that specie. Radicals which can be used for reaction with a silicon substrate include one of the elements: N, C, O, H, F, He, and Ar by itself; two or more of the elements N, C, O, H, F, He, and Ar, in groups with one another (e.g., NO); or one or more of the elements N, C, O, H, F, He, and Ar, in groups with other elements (e.g., NO+$D_2$).

The term "remote" as used herein, refers to the location of the source of charged particles and radicals, with respect to the destination of the charged particles and radicals. By placing the charged particle and specie's generator at a remote position relative to the wafer, charged particles, such as ions, can be separated from the radicals to thereby prevent damage (by such charged particles) to the substrate surface. The flow rate of the gas through the remote source may range from about 1 to about 10,000 sccm, and typically will average about 1000 sccm. The pressure may range from about 1 millitorr (mt) to about 10,000 mt.

To determine and control the residence time of the radicals in the reactor, the diameter of the reactor will range from about 200 millimeters (mm) to about 500 mm for the length of the reactor, and typically will be about 200 mm, while the length of the reactor may range from about 10 mm to about 500 mm, and typically will be about 250 mm for 200 mm wafers.

The depth of the penetration into the substrate of the radicals is determined by the kinetic energy of the radicals which can be controlled by a bias applied, if needed, between the remote plasma source and the substrate or the underlying substrate support, to limit the depth of the radicals in the substrate to only a few atomic layers under the surface of the substrate. Such a bias, when used, will comprise an RF power bias ranging from 0 to about 5000 W.

Such remotely generated high energy radical plasma sources are commercially available from, for example, Applied Materials' Decoupled Plasma Nitridation (DPN) Chamber or from Novellus System's Directional Downstream Plasma Source on IRIDIA Chamber system.

FIG. 4 schematically shows radicals 24 on surface 32 of substrate 30, while FIG. 5 shows these energized radicals 24 as originating from a remote plasma source 26.

d. The Selective Heating or Annealing of the Substrate Surface

Selective heating or annealing of a predetermined area of the surface of silicon substrate 30 can be carried out using a light source, such as a commercially available Excimer Laser Annealing system by Lambda Physik Japan Co. The light source may be focused or defocused in the X-Y plane of the substrate to control the area of the substrate subject to exposure to light, while the intensity and wavelength of the light source will determine the depth of the light energy along the Z axis. The range of the intensity of the light will range from about 10 mJ/$cm^2$ to about 500 mJ/$cm^2$.

Control of the light energy transmitted to the substrate surface is important to inhibit migration of prior doping materials and/or impurities in the substrate, as well as to preserve the thermal budget. The supply of light energy will result in the excitation of electrons from their ground energy state in (and the formation of chemical bondings among) the substances residing on the surface or within a range of a few atomic layers under the surface of surface, and hence changes the structures of the surface as well as the underlying few atomic layers.

FIGS. 4 and 5 show, at 20, a light source, such as a pulsed laser of short wavelength ranging from about 100 nm to about 1000 nm. FIG. 5 further shows that the light energy may be reflected, by mirror 50, from light source 20 to surface 32 of substrate 30 located on a cold chuck 36 (to further inhibit heating of substrate 30). Mirror 50 may also serve to further adjust or focus the beam of light energy as well as to provide for sweep of the light energy beam across the substrate surface.

e. Formation of $SiO_2$ Layer over Silicon Substrate Surface

As shown in FIG. 6, surface 32 of silicon substrate 30 may have formed thereon a layer 34 of silicon oxide ($SiO_2$) using the previously discussed source of spatially selective light energy such as pulsed laser source 20, together with an oxygen plasma having oxygen radicals therein and formed from a remote source. This process can also be used to remove native oxides from the silicon substrate surface using hydrogen (H) or fluorine (F) as the source of radicals in the plasma, and using a scanning beam of light energy, e.g., a scanning laser beam.

Alternatively, silicon substrate surface 32 may be pre-cleaned to remove all impurities, including native oxides, from the silicon substrate surface after which a pattern of silicon oxide may be formed on the silicon oxide surface, using the laser beam to provide a pattern of localized thermal energy on the silicon surface of the substrate to catalyze a reaction between the silicon substrate and the oxygen radicals in the oxygen plasma thereby forming a pattern of silicon oxide on the surface of the cleaned silicon wafer.

In all of the above, it will be noted that the treatment is limited to the surface of the silicon substrate to have minimal effect on the thermal budget of the substrate, as well as inhibiting migration of impurities within the substrate.

f. Formation of SiON Layer over Silicon Substrate Surface

If it is desired to form a layer 40 of, for example, silicon oxynitride (SiON) on surface 32 of silicon substrate 30, a source of nitrogen radicals may be added to the oxygen radicals to react with silicon surface 32 to form SiON layer 40, as shown in FIG. 7A. Alternatively, as shown in FIG. 7B, nitrogen radicals can be used to react with $SiO_x$ film 34 to also form SiON layer 40. The process can be stopped while some of $SiO_2$ layer 34 still remains on the surface, or can be carried out until all the $SiO_2$ of layer 34 is converted to SiON layer 40. The formation of SiON layer 40 is limited to a surface reaction since the energy in the light source (e.g., the laser beam) only locally heats surface 32 of substrate 30, not the bulk substrate.

g. Formation of Silicon Nitride Layer over Silicon Substrate Surface

In the prior art, silicon nitride ($Si_3N_4$) was formed by using ammonia ($NH_3$) while heating the entire substrate, thereby causing reaction between the nitrogen in the ammonia and the silicon in the surface of the silicon wafer. However, this can cause undesirable migration of dopant impurities (which may have been deliberately doped to a specific depth in the substrate). As shown in FIG. 8, in accordance with the invention, only surface 32 of the silicon substrate 30 is heated, e.g., using a scanning laser beam (which may scan in both the X and Y axis) or a defocused laser beam or any other source of thermal energy which is the functional equivalent to the laser beam and will not provide any significant amount of thermal energy to the underlying substrate. A nitrogen radical 62 reacts with the heated surface 32 of silicon substrate 30 to form the desired silicon nitride layer 60 shown in FIG. 8.

h. Passivation of an Interface between a Silicon Substrate and a Gate Dielectric FIG. 9 generally shows a passivation with hydrogen of the interface between surface 32 of silicon substrate 30 and gate dielectric layer 64. In the practice of the prior art, a layer of gate dielectric would be formed over a layer of silicon, thus creating an interface between the silicon substrate surface and the abutting gate dielectric surface. The structure would then be heated in a hydrogen atmosphere thereby causing the hydrogen to thermally diffuse through the gate dielectric layer to the interface. The problem with this prior art process was that the entire substrate was heated, thus resulting in the thermal diffusion of other dopants and/or impurities through some or all of the heated silicon substrate to regions of the silicon where the presence of the dopant or impurity was undesirable.

In accordance with the process of the invention, layer 64 of gate dielectric is formed over layer 30 of silicon to create the interface between silicon substrate surface 32 and the abutting gate dielectric surface, as described above, and the structure is then placed on substrate support 36. Then the structure is exposed to hydrogen radicals 90 from a remote hydrogen plasma while maintaining, if needed, a bias on substrate support 36 to bias the structure, causing hydrogen radicals 90 to embed into gate dielectric layer 64, and accumulate at the interface. At the same time, high energy beam source 20 (e.g., the pulsed laser) sweeps across the gate dielectric layer 64 to locally heat the gate dielectric layer (but not the underlying silicon substrate 30) causing the hydrogen to diffuse through gate dielectric layer 64, and into the interface region, thus providing the desired passivation of the silicon/gate dielectric interface without heating silicon substrate 30 and thereby avoiding undesired thermal diffusion through silicon substrate 30 of dopants and/or impurities present in silicon substrate 30.

i. Passivation of an Interface between a Gate Electrode and a Gate Dielectric As shown in FIG. 10, the structure of FIG. 9 may have a gate electrode layer 70 on top of gate dielectric layer 64. According to the current invention, the structure can be exposed to a remote hydrogen plasma while maintaining a preferred voltage bias on the substrate support to bias the structure, causing the hydrogen radicals 90 to embed into gate electrode layer 70. At the same time, the high energy light beam source 20 (e.g., the pulsed laser) sweeps across the gate electrode layer 70 to locally heat the layer (but not the underlying silicon substrate 30) causing the hydrogen radicals 90 to diffuse through the gate electrode layer 70 into the interface region between gate electrode 70 and gate dielectric 64, thus providing the desired passivation of the gate electrode/gate dielectric interface without heating the silicon substrate and thereby avoiding undesired thermal diffusion through the silicon substrate of dopants and/or impurities present in the silicon substrate.

j. Reduction of $CuO_x$ to Cu on the Bottom of Via Surface Before Ta/TaN Liner Deposition In the prior art, an RF sputter was used to remove any oxidized layer on top of the Cu surface before Ta/TaN barrier layer deposition. However, the RF sputter can attack the low K film and re-deposit Cu to the via sidewall. FIG. 11 generally shows a reduction of $CuO_x$ 82 to Cu 80 on the bottom of the via surface, using the current invention. In accordance with the invention, pulsed light source 20 can be used simultaneously in combination with hydrogen radicals 90 from a remotely generated plasma to convert the thin layer 82 of $CuO_x$, to metallic Cu 80.

Thus, a process, and apparatus for carrying out the process, are disclosed for exposing a substrate to reactive radicals generated by a remote plasma source, and simultaneously exposing one or more selected portions of the substrate surface to a source of light energy focused on the selected portion of the substrate surface, whereby local reaction will be facilitated between the radicals in the plasma and the portion of the substrate surface being selectively heated by the source of thermal energy, without, however, heating the remainder of the substrate.

Having thus described the invention what is claimed is:

1. A method for treating a surface of a substrate, the method comprising the steps of:
    exposing at least a portion of the surface to remotely generated radicals, while simultaneously,
    exposing the portion of the surface to laser light without exposing a remainder of the substrate to the laser light,
    wherein the substrate is subject to a radio frequency voltage bias that controls a depth of penetration of the radicals into the substrate.

2. The method of claim 1, wherein the substrate is a silicon substrate.

3. The method of claim 1, wherein the laser light has a wavelength of between about 100 nanometers and about 1,000 nanometers.

4. The method of claim 1, wherein the laser light has an intensity of between about 10 millijoules per square centimeter and about 500 millijoules per square centimeter.

5. The method of claim 1, wherein the radicals are selected from the group consisting of oxygen, nitrogen, carbon, hydrogen, fluorine, helium, argon, and mixtures thereof.

6. The method of claim 1, wherein the radio frequency voltage bias has a power of up to about 5,000 watts.

7. The method of claim 1, wherein the surface includes silicon, and the radicals include oxygen, and the method produces a layer of silicon oxide.

8. A method for treating a surface of a substrate, the method comprising the steps of:
    exposing at least a portion of the surface to remotely generated radicals, while simultaneously,
    exposing the portion of the surface to laser light without exposing a remainder of the substrate to the laser light,
    wherein the surface includes copper oxide, and the radicals include hydrogen, and the method reduces the copper oxide to copper.

9. A method for treating a surface of a substrate, the method comprising the steps of:
    exposing at least a portion of the surface to remotely generated radicals, while simultaneously,
    exposing the portion of the surface to laser light without exposing a remainder of the substrate to the laser light,
    wherein the surface includes silicon oxide, and the radicals include at least one of hydrogen and fluorine, and the method reduces the silicon oxide to silicon.

10. A method for treating a surface of a substrate the method comprising the steps of:
    exposing at least a portion of the surface to remotely generated radicals, while simultaneously,
    exposing the portion of the surface to laser light without exposing a remainder of the substrate to the laser light,
    wherein the surface includes silicon, and the radicals include nitrogen and oxygen, and the method produces a layer of silicon oxy-nitride.

11. A method for treating a surface of a substrate, the method comprising the steps of:
    exposing at least a portion of the surface to remotely generated radicals, while simultaneously,
    exposing the portion of the surface to laser light without exposing a remainder of the substrate to the laser light,
    wherein the surface includes silicon oxide, and the radicals include nitrogen, and the method produces a layer of silicon oxy-nitride.

12. A method for treating a surface of a substrate, the method comprising the steps of:
    exposing at least a portion of the surface to remotely generated radicals, while simultaneously,
    exposing the portion of the surface to laser light without exposing a remainder of the substrate to the laser light,
    wherein the surface includes silicon, and the radicals include nitrogen, and the method produces a layer of silicon nitride.

13. A method for treating a surface of a substrate, the method comprising the steps of:
    exposing at least a portion of the surface to remotely generated radicals, while simultaneously,
    exposing the portion of the surface to laser light without exposing a remainder of the substrate to the laser light,
    wherein the surface includes a layer of silicon oxide on top of a silicon substrate, and the radicals include hydrogen, and the method hydrogenates an interface between the layer of silicon oxide and the silicon substrate.

14. A method for treating a surface of a substrate, the method comprising the steps of:
    exposing at least a portion of the surface to remotely generated radicals, while simultaneously,
    exposing the portion of the surface to laser light without exposing a remainder of the substrate to the laser light,
    wherein the surface includes an electrically conductive layer on top of an electrically insulating layer, and the radicals include hydrogen, and the method hydrogenates an interface between the electrically conductive layer and the electrically insulating layer.

* * * * *